United States Patent
Banerjee et al.

(10) Patent No.: US 10,534,565 B1
(45) Date of Patent: Jan. 14, 2020

(54) PROGRAMMABLE, AREA-OPTIMIZED BANK GROUP ROTATION SYSTEM FOR MEMORY DEVICES

(71) Applicant: Cadence Design Systems, Inc., San Jose, CA (US)

(72) Inventors: Bikram Banerjee, San Jose, CA (US); Anne Hughes, San Jose, CA (US); John M. MacLaren, San Jose, CA (US)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 0 days.

(21) Appl. No.: 15/951,107

(22) Filed: Apr. 11, 2018

(51) Int. Cl.
*G06F 3/06* (2006.01)
*G11C 11/4094* (2006.01)
*G11C 11/408* (2006.01)
*G11C 11/4096* (2006.01)
*G11C 11/4076* (2006.01)

(52) U.S. Cl.
CPC .......... *G06F 3/0659* (2013.01); *G06F 3/0611* (2013.01); *G06F 3/0673* (2013.01); *G11C 11/4076* (2013.01); *G11C 11/4085* (2013.01); *G11C 11/4094* (2013.01); *G11C 11/4096* (2013.01)

(58) Field of Classification Search
CPC .... G06F 3/0659; G06F 3/0611; G06F 3/0673; G11C 11/4076; G11C 11/4085; G11C 11/4094; G11C 11/4096
See application file for complete search history.

(56) References Cited

U.S. PATENT DOCUMENTS

| 5,822,772 A * | 10/1998 | Chan | G11C 7/22 711/158 |
| 2008/0034132 A1* | 2/2008 | Nakatake | G06F 13/28 710/35 |
| 2016/0342539 A1* | 11/2016 | Bains | G06F 13/16 |
| 2016/0378366 A1* | 12/2016 | Tomishima | G11C 7/1072 711/154 |
| 2017/0194045 A1* | 7/2017 | Kang | G11C 5/025 |

* cited by examiner

*Primary Examiner* — Eric Cardwell
(74) *Attorney, Agent, or Firm* — McDermott Will & Emery LLP

(57) ABSTRACT

A device including an address extraction for a data burst associated with a host processor and to map the data burst to a memory according to a rotation is provided. The device includes a splitter to separate a first command that associates the data burst with a first round in the rotation, and a selection logic to select, from the first round in the rotation, a first bank group at the address in the memory to execute the first command, and execution logic to receive the data burst and the address in the memory to activate the first bank group at the address in the memory, and to schedule an execution of the first command based on an availability of a second bank group from the first round in the rotation. A system and a non-transitory computer readable medium storing instructions to use the device are also provided.

20 Claims, 5 Drawing Sheets

US 10,534,565 B1

PROGRAMMABLE, AREA-OPTIMIZED BANK GROUP ROTATION SYSTEM FOR MEMORY DEVICES

TECHNICAL FIELD

Embodiments described herein are generally related to the field of memory control in computing device applications. More specifically, embodiments described herein are related to efficient memory control for random access memory (RAM) in computing devices, such as dynamic RAM (DRAMs) and synchronous DRAMs (SDRAMs).

BACKGROUND

Current computer systems rely heavily on the performance of RAM memory devices. However, there is a bottleneck at the computer interface between a host processor and the RAM that causes undesirable latency even with the most advanced memory architectures. Furthermore, for state-of-the-art RAM technology, system performance may depend strongly on both the application being executed, and the data traffic profile between the host processor and the RAM. While increasing RAM frequency and buffer space at the controller interface may provide partial performance improvement, these approaches are power consuming and also tend to occupy device space in the controller, which is undesirable.

The description provided in the background section should not be assumed to be prior art merely because it is mentioned in or associated with the background section. The background section may include information that describes one or more aspects of the subject technology.

SUMMARY

In certain aspects, a device as disclosed herein includes an address extraction circuit configured to extract a host address for a data burst associated with a host processor, and to map the host address to an address in a memory circuit according to a bank group rotation. The device also includes a command splitter configured to separate a first command that associates the data burst with a first round in the bank group rotation, a selection logic configured to select, from the first round in the bank group rotation, a first bank group at the address in the memory circuit to execute the first command, and an execution logic configured to receive the data burst and the address in the memory circuit. The execution logic circuit activates the first bank group at the address in the memory circuit, and schedules an execution of the first command based on an availability of a second bank group from the first round in the bank group rotation.

In certain aspects, a system as disclosed herein includes a host memory storing instructions, and at least one host processor that executes the instructions and transmits or receives multiple data bursts associated with the instructions. The system also includes a controller coupled to a second memory and to the host processor, the controller configured to access a memory address in the second memory to read or write at least one of the data bursts at the memory address. To access the memory address in the second memory, the controller is further configured to split a command associated with the data bursts into a first command for a first data burst in a first round of a bank rotation schedule, and a second command for a second data burst in a second round of the bank rotation schedule, to select the memory address to a first bank group in the first command, to queue the second command after the first command, and to execute the first command in the memory address.

In certain aspects, a computer-implemented method is disclosed, including extracting a host address for a data burst associated with a host processor and mapping the host address to a memory address in a memory circuit according to a bank group rotation. The computer-implemented method also includes selecting a first command that associates the data burst with a first round in the bank group rotation, selecting, from the first round in the bank group rotation, a first bank group at the memory address in the memory circuit to execute the first command, activating the first bank group at the memory address in the memory circuit, to process the data burst, and scheduling an execution of the first command based on an availability of a second bank group from the first round in the bank group rotation.

In certain aspects, a non-transitory, computer-readable medium comprising instructions stored in a memory which, when executed by a host processor cause a computer to perform a method. The method includes extracting a host address for a data burst associated with a host processor, mapping the host address to a memory address in a memory circuit according to a bank group rotation, and selecting a first command that associates the data burst with a first round in the bank group rotation. The method also includes selecting, from the first round in the bank group rotation, a first bank group at the memory address in the memory circuit to execute the first command, activating the first bank group at the memory address in the memory circuit, to process the data burst, and scheduling an execution of the first command based on an availability of a second bank group from the first round in the bank group rotation.

In certain aspects, a system is described including a means for storing instructions. The system further includes a means to execute the instructions to extract a host address for a data burst associated with a host processor, to map the host address to a memory address in a memory circuit according to a bank group rotation, and to select a first command that associates the data burst with a first round in the bank group rotation. The means to execute instructions is also configured to select, from the first round in the bank group rotation, a first bank group at the memory address in the memory circuit to execute the first command, to activate the first bank group at the memory address in the memory circuit, to process the data burst, and to schedule an execution of the first command based on an availability of a second bank group from the first round in the bank group rotation.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Figure 1:
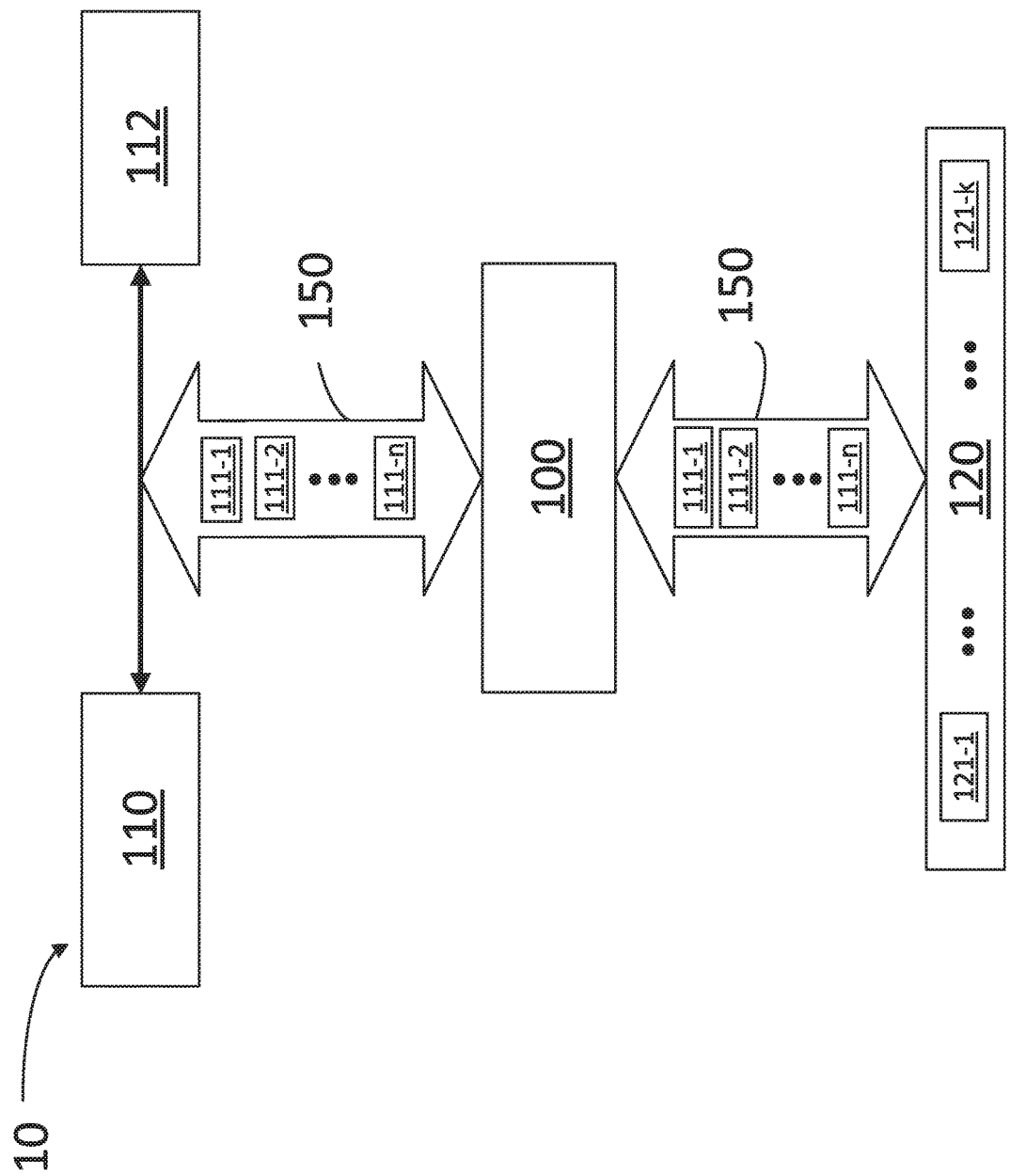
FIG. 1 illustrates a portion of a computing device including a controller for a memory coupled to a host processor, according to some embodiments.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for memory control in computing device applications. More specifically, embodiments as disclosed herein may be used for controlling access and command scheduling in a RAM memory coupled with a host computer.

Memory devices such as double-data read (DDR) SDRAMs (e.g., DDR4 and DDR5) have memory banks including multiple data pages, wherein the memory banks are organized in bank groups. Commands directed to the memory (e.g., Read/Write commands) may address a same bank group and be queued in sequence, thus incurring timing penalties and loss of streaming bandwidth, ultimately reducing throughput and slowing the processing capabilities of a host computer. The number of bank groups and the penalties incurred for consecutive transactions differ between device families. The amount of throughput penalty that is encountered also depends on traffic profile, and varies between applications executed by the host computer.

For example, memory devices in the DDR5 category may include up to eight (8) bank groups. In such scenario, the penalty incurred by consecutive commands addressed to the same bank group may be four (4) data bursts, or more (e.g., a data burst may be written to, or read from, after four data bursts in a subsequent command addressing a same bank group as the initial command). While some of the more advanced memory architectures are in the initial phase of development (e.g., DDR5 is in version 0.1), throughput optimization is recognized as a desirable solution to the ever increasing traffic needs. Hence, embodiments as disclosed herein provide a solution to the above technical problem by applying very-large system integrated (VLSI) hardware as a part of a System-on-Chip (SoC) architecture. Accordingly, embodiments as disclosed herein include digital core architectures integrated into a chip to handle Read/Write commands and other housekeeping commands to a memory interacting with a host processor (e.g., a RAM). In some embodiments, the logic and commands disclosed herein may be implemented at the silicon gate level of logic circuitry in the memory controller of a host computer.

The disclosed system addresses a technical problem tied to computer technology, namely the technical problem of efficiently accessing memory (e.g., RAM) without causing computational bottlenecks and making maximum use of hardware capabilities. Accordingly, systems and methods as disclosed herein improve the function of a computer by reducing computation latency and increasing memory bandwidth by making an efficient use of hardware in a controller for the memory circuit.

This disclosure includes a programmable bank group rotation mechanism, wherein consecutive transaction addresses are rotated between a programmable number of bank groups. Accordingly, embodiments as disclosed herein substantially reduce throughput penalties by mapping consecutive addresses from the host computer (e.g., a host processor and a host memory) to different bank groups. The programmable option helps a system architect to enable as much rotation as required by the application executed in the host computer.

Embodiments as disclosed herein provide the technical advantage of a programmable bank group rotation feature that can be tuned according to a traffic profile for maximum data throughput. The solution provided by embodiments disclosed herein is also scalable to memory architectures having any number of bank groups because the number of user/system address bits used for the programmable bank group rotation is decoupled from the actual hardware resources allocated for the bank group rotation in the controller. Further, some embodiments include a command-splitting feature to handle bank group rotation schedules when a single command includes addresses for more bank groups that can fit within a single round in a bank group rotation schedule. Accordingly, the command splitting feature enables a reduction of the logic area for activating and pre-charging bank groups prior to executing Read/Write commands, in the memory controller. Moreover, some embodiments include an intelligent command de-queuing logic, which is synchronized with the bank group rotation schedule, to decrease overall latency. The enhanced performance of a memory controller operating according to embodiments disclosed herein may be observable at the memory interface, as the bank group addresses are rotated accordingly during data burst transactions.

FIG. 1 illustrates a portion of a computing device 10 including a controller 100 for a memory 120 coupled to a host processor 110, according to some embodiments. A host memory 112 stores instructions which, when executed by host processor 110, cause host computer 10 to execute, at least partially, methods as disclosed herein. Memory 120 may include a dynamic, random access memory (DRAM) having an architecture that includes data stored in bank groups 121-1 through 121-$k$ (hereinafter, collectively referred to as "bank groups 121"). Each of bank groups 121 in memory 120 is associated with a memory address. Bank groups 121 include banks having one or more memory pages. In some embodiments, multiple bank groups 121 may share the same or a similar memory address.

In some embodiments, controller 100 receives, from processor and host memory 112, data bursts 111-1, and 111-2 through 111-$n$ (hereinafter, collectively referred to as "data bursts 111") over a bus 150, and provide data bursts 111 to memory 120. In some embodiments, controller 100 provides data bursts 111 to host processor 110 and to host memory 112 over bus 150, from memory 120. Accordingly, embodiments as disclosed herein implement a bank rotation schedule for transferring data into and from memory 120 such that bus 150 is constantly in operation, thus increasing the data transfer efficiency.

Host processor 110 may be part of a host and memory 120 may be RAM installed on the host. Host processor 110 may be executing an application installed on the host. Controller 100 executes commands to transfer input data 111 from memory 120 to host processors 110 and to provide data bursts 111 to memory 120, for storage. Controller 100 may also execute housekeeping commands including error checks in data bursts 111, page activation (e.g., prior to writing/reading data), page closing (e.g., after writing/reading data), and refresh commands to avoid data corruption.

In some embodiments, controller 100 is configured to operate at a data rate of 3200 mega-transfers per second (MT/s, 1 MT/s=$10^6$ transfers/s) up to 6400 MT/s Controller 100 may be compatible with a wide variety of electrical protocols such as DDR2, DDR3, DDR4, low-power-DDR3 (LPDDR3), LPDD4, LPDDRL, open-NAND-flash-interface (ONFI), and the like. Accordingly, systems as disclosed herein may be compatible with a variety of DRAM devices. A factor in the performance of controller 100, (e.g., bit-error-rate, BER) is the area occupied by the circuit logic, which impacts the environment conditions of operation of controller 100, such as temperature. Temperature affects the supply noise generated by host processor 110 and self-generated noise from input and output ports for data bursts 111.

In some embodiments, controller 100 is configured to access a memory address in memory 120 to read or write at least one of data bursts 111 at the memory address. In some embodiments, to access the memory address in memory 120, controller 100 is configured to split a command associated with data bursts 111 into a first command for first set of data burst 111-1 in a first round of a bank rotation schedule, and a second command for a second set of data bursts 111-2 in a second round of the bank rotation schedule. In some embodiments, controller 100 is further configured to select the memory address in memory 120 to a set of banks in a first set of bank groups in the first command, to queue the second command after the first command, and to execute the first command in the memory address of memory 120.

Figure 2:
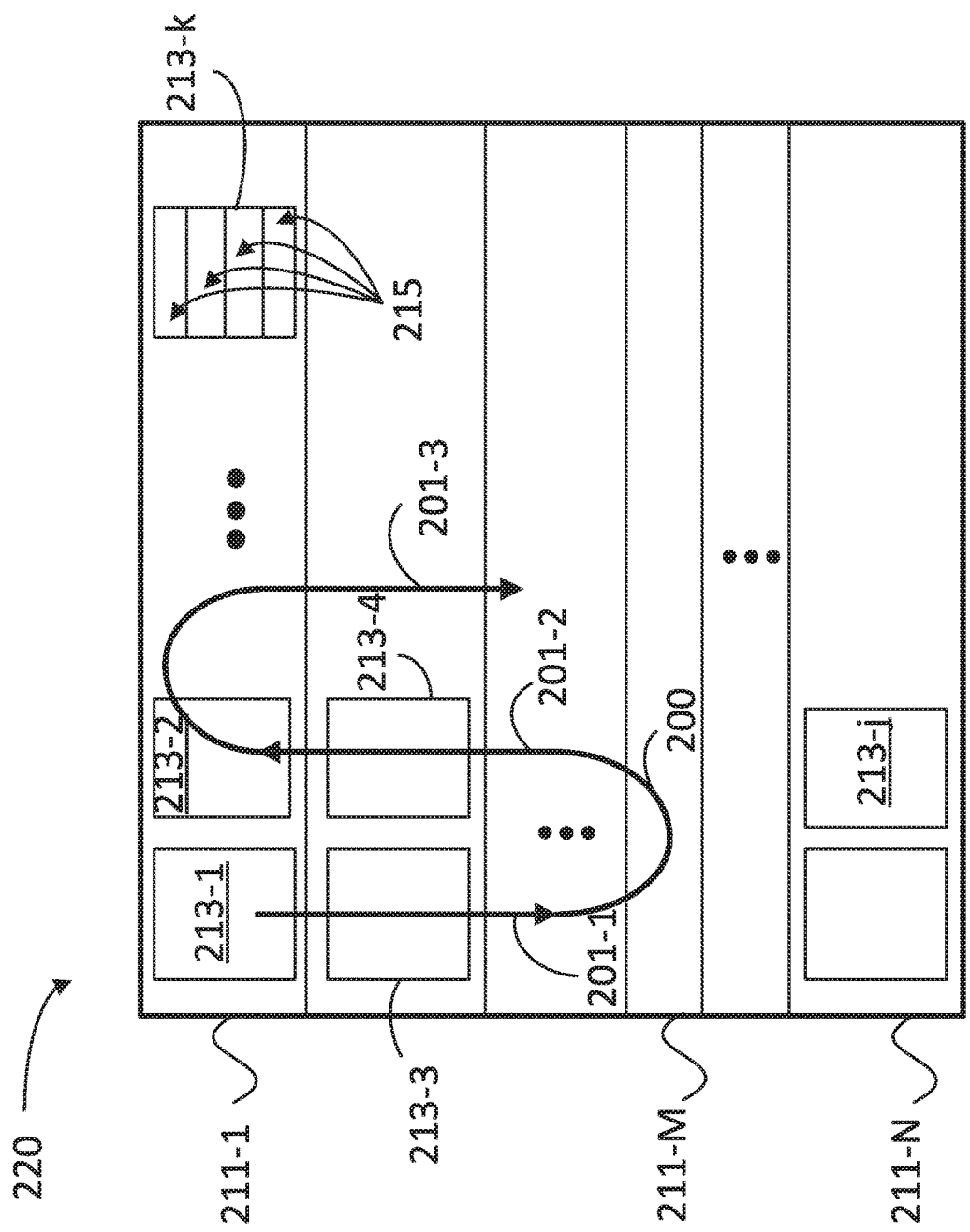
FIG. 2 illustrates a bank group rotation schedule in a memory architecture, according to some embodiments.

FIG. 2 illustrates a bank group rotation schedule 200 in a memory 220, according to some embodiments. Memory 220 may be a RAM as discussed above (DRAM, SDRAM, and the like). Accordingly, memory 220 may include bank groups 211-1 through 211-N (hereinafter, collectively referred to as "bank groups 211"), which may be partitioned into banks 213-1 through 213-j (hereinafter, collectively referred to as "banks 213"). In some embodiments, each of banks 213 includes a plurality of pages 215, storing data. For example, in some embodiments (e.g., embodiments including a DDR4 architecture) a total of eight banks 213-1 through 213-8 may be divided into two bank groups 211-1 and 211-2, with four (4) banks 213, each. In some embodiments (e.g., including a DDR5 architecture), up to thirty two banks 213-1 through 213-32 may be grouped into eight bank groups 211-1 through 211-8 of four banks 213, each. Future architectures (e.g., DDR6) may include up to sixteen (16) bank groups, thirty two (32) bank groups, or even more.

Embodiments as disclosed herein include memory controllers that decouple the number of user/system address bits for hardware resources (e.g., bank groups 211) from memory 220 (e.g., the total number of bank groups 211 and the number of banks 213 in each bank group 211). Embodiments as disclosed herein are scalable to a state-of-the-art memory 220 in that the same hardware (e.g., controller 100) may simply scale to a higher bank group rotation schedule to meet system performance (e.g., a memory 220 with a higher number of bank groups 211, and banks 213). Accordingly, system latency is not impacted by coupling the memory controller to a memory having a memory 220 including a new, potentially higher count of bank groups 221. Accordingly, in some embodiments a memory controller as disclosed herein may be configured to operate with a next generation memory architectures for performance/data-throughput.

Bank group rotation schedule 200 includes a sequence of bank group rotation rounds 201-1, 201-2, and 201-3 (hereinafter, collectively referred to as "bank group rotation rounds 201"). Accordingly, a memory transaction occurring within the span of one bank group rotation round 201 targets M different bank groups for each memory transaction. Bank group rotation schedule 205 includes a sequence of memory banks 213 in different bank groups 221 that are accessed by the memory controller during a command execution, according to embodiments disclosed herein. Each of bank group rotation rounds 201 includes the same number of banks 213 that are accessed in sequence (e.g., M). Moreover, in some embodiments the number, M, of bank groups associated with each bank group rotation round 201, is programmable. Accordingly, the controller may be configured to support a memory 220 having a high number, N, of bank groups 221 using a large round value for the bank rotation, e.g. M=N bank groups per-round. However, the same controller may support a memory 220 having any lower number of bank group rotations, M<N. Moreover, in some embodiments the size of the bank rotation round may also be adjusted according to the system traffic profile. Hence, with the scalable M factor, the flexibility is also built-in, according to some embodiments.

In embodiments as disclosed herein, the number, M, of bank groups per bank group rotation round may be selected to reduce an over-all system latency in view of a given data traffic condition, or to adjust to a memory specification. Accordingly, from the perspective of a host processor, bank group rotation schedule 205 multiplies the size of pages 215 by a factor M, because for every bank rotation round 201 the controller opens a page in each of M bank groups.

Figure 3:
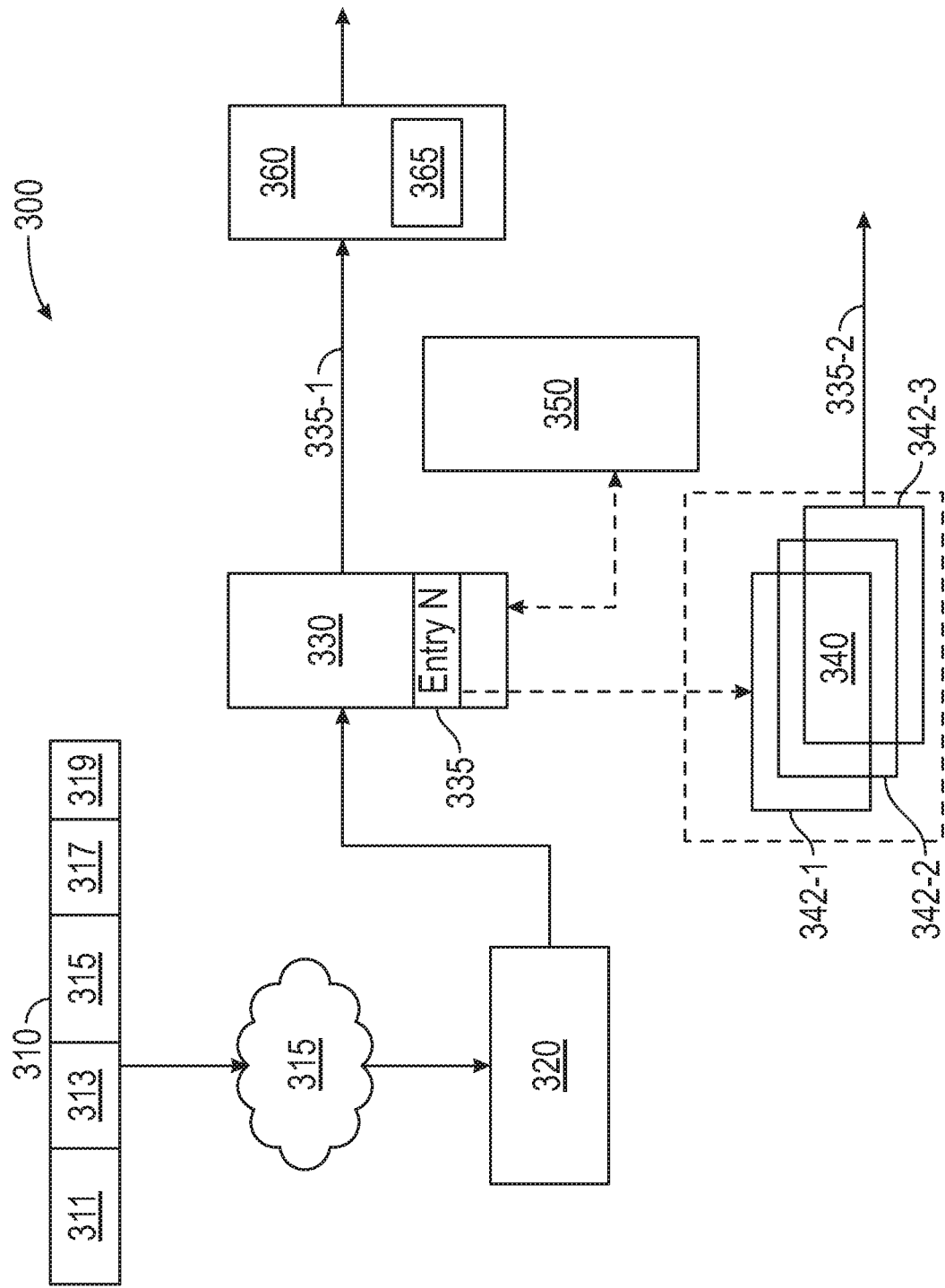
FIG. 3 is a block diagram illustrating hardware and steps in a bank group rotation system for controlling a memory, according to some embodiments.

FIG. 3 is a block diagram illustrating hardware and steps in a bank group rotation system 300 for controlling a memory, according to some embodiments. Blocks and structures in bank group rotation system 300 may be implemented as logic circuitry in a memory controller configured to execute commands on a memory, upon requests to handle data bursts from a host processor or a host memory (e.g., controller 100, data bursts 111, host processor 110, and host memory 112).

A command address block 310 prepares a string of bits indicating a target address in the memory for the command associated with a data burst (e.g., READ/WRITE, or other housekeeping function on memories 120 and 220). In some embodiments the bit string in command address block 310 is a mapping establishing a route for the data bursts from the host memory or the host computer to a bank group in the memory (e.g., a RAM). A sequential address for multiple data bursts will be sent to different bank groups. Command address block 310 may include bits such as a ROW bit 311, indicating a row in a memory page (e.g., page 215); a BA/BG bit string 313, indicating a bank group in the memory (e.g., bank groups 221). A BG bit string 317 indicates the number of bank groups that are rotated (e.g., M). To rotate a bank group after a data burst, the bank group number has to change. For example, for N=8 bank groups (3 bits) with M=4 rotation scheme, BG bit string 317 will include 2 bits and BG bit string 313 will include the remaining 1 bit (e.g., indicating which of the two sets of 4 bank groups is being rotated). COL bit strings 315 and 319 represent the bits to identify a column. In some embodiments, a column may be identified with 10 bits. With COL bit string 319 indicating the number of column bits consumed in a burst (e.g., 6 out of 10 bits), and COL bit string 315 includes the remaining 4 out of 10 bits. For example, in a single burst, COL bit string 319 may be accessed by a read/write command and then, as the address is linearly incremented for the next burst, BG bit string 317 is automatically incremented, yielding an address to a new bank group in the bank group rotation scheme. Accordingly, a portion (or all) of BG bit string 317 is inserted into the column address of a read/write command at the appropriate point, causing bank group rotation as the address is increased burst by burst.

Address extraction block 315 parses command address block 310 to extract the bits over the memory burst address in the column field as BG bits as per programmed value. In some embodiments, address extraction block 315 concatenates address bits for multiple data bursts, including multiple bank groups to be targeted, in view of the total number of BGs and banks present in the device. Address extraction block 315 provides the concatenated bit string including the bank groups to be targeted to a command splitter block 320.

In some embodiments command splitter block 320 is configured to optimize gate area in the memory controller by splitting command address blocks 310 into command strings having no more than a pre-selected number of memory bursts (e.g., M), each directed to a different bank group in the memory. The precise value of M is adjustable, and depends on the memory architecture, data traffic, and other factors (e.g., M=4). Each command string can be treated as an M-sized bank group rotation round (e.g., bank group rotation rounds 201). Splitting command address block 310 into command strings addressing M bank groups optimizes the use of gate area in the memory controller, without performance impact, because when the data traffic increases, and the memory architecture so permits, the value of M may be increased accordingly.

Command splitter block 320 provides the command strings to a command queue 330, wherein each command string forms a command entry 335: Each command entry 335 will target M banks in the corresponding bank groups in the memory, to read/write the M data bursts (one data burst per bank). In some embodiments, command queue 330 may include a first-in, first-out (FIFO) data buffer where command entries 335 are placed in sequence, as they arrive from command splitter block 320. In some embodiments, command entries 330 may introduce a delay spacing in clock cycles between command entries 335. Command entries 335 may include read/write command 335-1 and housekeeping command 335-2 (e.g., activate opening page, pre-charge-close page-commands, and the like).

For example, in some embodiments command splitter block 320 may split a command string 310 from the host processor that includes eight bank groups (e.g., including eight data bursts as well) into two command entries 335 of four bank groups, each. Accordingly, the two command entries can be sent back-to-back (e.g., in two bank group rotation rounds) and, instead of preparing eight bank groups, only four bank groups are prepared and pre-charged during each round.

Accordingly, bank preparation modules 340 are configured to prepare, in parallel, the M bank groups for data transfer (e.g., read or write). Bank preparation modules 340 issue bank prep commands such that the bank starting the transfer is prepared first, and so on. In some embodiments, bank preparation modules 340 provide pre-charge/activate commands to the target bank in a bank group of the memory. When a command entry 335 targets less than M memory bursts (e.g., K<M), then the K banks targeted are prepared.

A selection logic block 350 selects a command entry 335 when it is ready to execute and sends it over to execution logic block 360. When a command entry 335 targets M bank groups, execution logic block 360 executes a data transfer on each target bank as is readied by the corresponding bank preparation module 340. Accordingly, and to reduce latency, in some embodiments execution logic block 360 may not wait for all M-banks in the bank rotation round to be ready, for data transfer. For example, when M=4, execution block 360 may issue a read/write command when the first two banks in the bank rotation round are ready for data transfer. In such configuration (M=4), the last two banks in the bank rotation may be readied while the data transfer is happening for the first two banks. Such scenarios may be detected at the memory interfaces.

Execution block 360 includes a bank group rotation logic 365 that rotates the M data bursts across the M bank groups for each of the bank rotation rounds. Bank group rotation logic 365 has knowledge of the starting bank in each bank rotation round and rotates the banks accordingly. In some embodiments, such bank rotation may be also observed at the memory interface. Bank group rotation is a resource hungry implementation, especially with memory architectures that include a larger number of bank groups (e.g., devices like DDR5 that have eight bank groups).

Bank group rotation logic 365 enables handling a variable bank group rotation round size (e.g., M), according to traffic profile (e.g., as demanded by a given application run by the host processor) and memory specifications (clock frequency, bank group number, N, and the like). In some embodiments, the data bursts may be random (e.g., non-sequential), and the value M may be adjusted in real time to allocate corresponding data bursts to the same bank.

In some embodiments, bank preparation module 340 is synchronized with bank group rotation logic 365 to maintain the appropriate timing between execution of command entries 335. The timing for the execution of command entries 335 is specified together with the frequency of the memory clock. For example, in some embodiments, a command-to-command lapse for the memory includes 32 clock cycles, with execution in the dropping and the rising edge of the clock (e.g., DDR5). Further, DDR5 devices may operate at clock frequencies of 1.6 GHz up to 3.2 GHz. Accordingly, a memory operating at 1.6 GHz may use 32 clock cycles before sending data to the same bank group. For a memory operating at 3.2 GHz with the same bank group rotation schedule, the command-to-command lapse to a same bank group may be 64 clocks. In some embodiments, bank rotation logic 365 may adjust the bank rotation schedule so as to maintain the same command-to-command lapse to a same bank group in the memory. Thus, in the above example bank rotation logic 365 may increase to 2M the number of bank groups in a bank rotation round for a clock operating at 3.2 GHz, when the number of bank groups in a bank rotation round is M, for a 1.6 GHz clock.

In some embodiments, a memory interface operating under a bank rotation schedule as disclosed herein may reveal a rotation of consecutive address transactions between the bank groups associated to each bank rotation round. At the memory interface, the transfer of data bursts starts when a minimum number of banks are ready to receive the first few bursts. Further, other banks at the memory may be pre-charged and readied by activate commands while the data transfer is in progress, thus reducing the overall latency of the data transactions, and improving performance of the memory controller.

Figure 4:
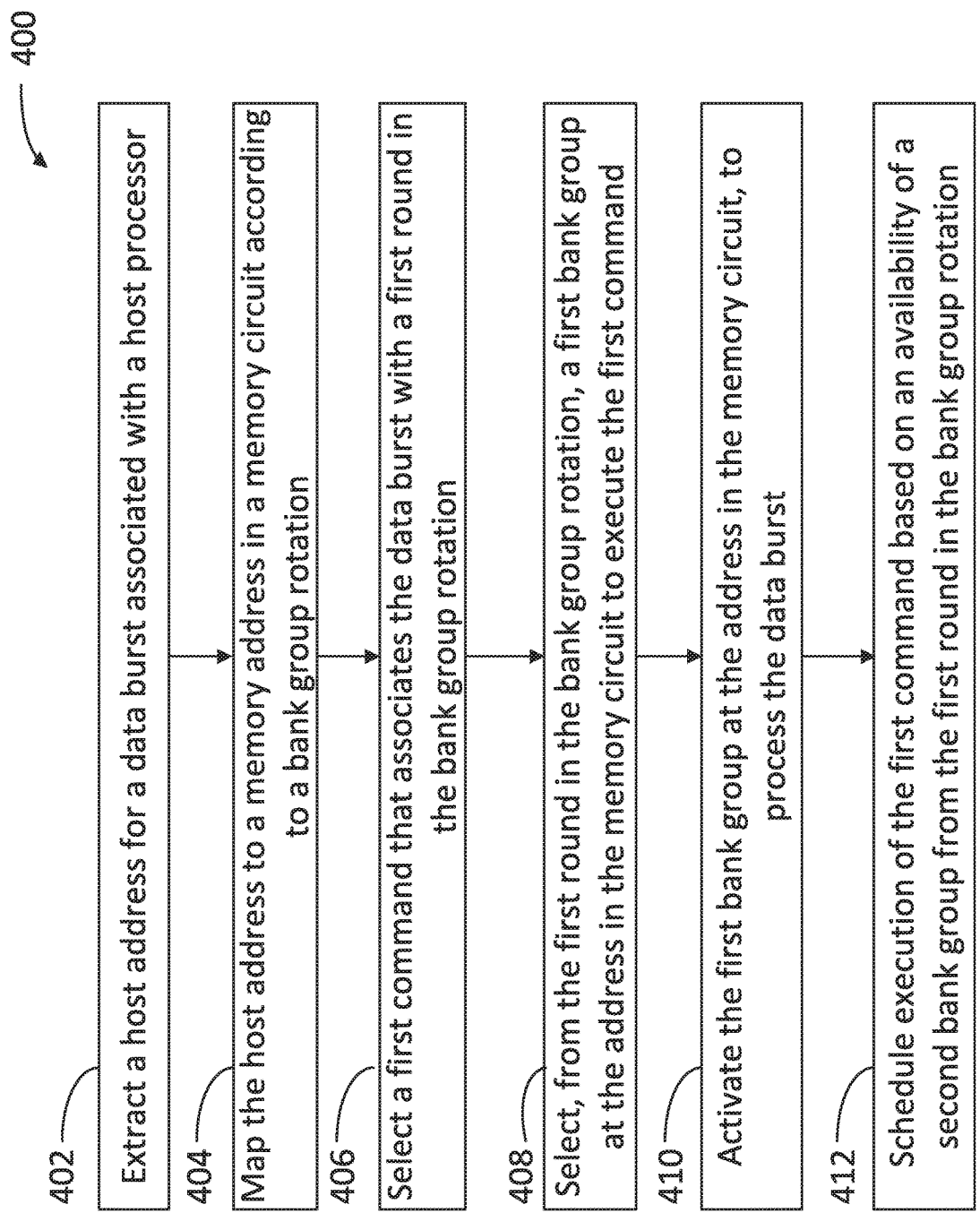
FIG. 4 illustrates a flow chart including steps in a method for controlling a memory with bank group rotation commands, according to some embodiments.

FIG. 4 illustrates a flow chart including steps in a method 400 for controlling a memory with a bank group rotation command schedule, according to some embodiments. Steps in method 400 may be at least partially executed by a computing device having a host processor, a host memory, a memory controller, and a random access memory (e.g., host processor 110, host memory 112, memory controller 100, and memory 120). Further, in some embodiments the memory controller may include an address extraction block, a command splitter block, a command queue, a selection logic block, an execution logic block, and a bank group rotation block (e.g., address extraction block 315, command splitter block 320, command queue 330, selection logic block 350, execution logic block 360, and bank group preparation block 340). Each of the above-identified blocks may perform, at least partially, one or more of the steps in method 400, as disclosed herein.

In embodiments consistent with the present disclosure, at least two or more of the steps in method 400 may be performed simultaneously, or overlapping in time. Moreover, in some embodiments a method consistent with the present disclosure may include one or more, but not all, of the steps in method 400, or one or more of the steps in method 400 performed in a different order.

Step 402 includes extracting a host address for a data burst associated with a host processor. In some embodiments, the data burst may be provided by the host processor as a result of a processing operation. In some embodiments, the data burst may be provided by the random access memory upon request from the processor in relation with a certain processing operation.

Step 404 includes mapping the host address to a memory address in a memory circuit according to a bank group rotation.

Step 406 includes selecting a first command that associates the data burst with a first round in the bank group rotation. In some embodiments, the first command is a write command and step 406 includes writing the data burst to the first bank group in the memory circuit. In some embodiments, step 406 includes splitting the first command into a second command, wherein the second command associates a second data burst with a second round in the bank group rotation.

Step 408 includes selecting, from the first round in the bank group rotation, a first group at the address in the memory circuit to execute the first command. In some embodiments, step 408 includes selecting a bank group rotation schedule based on a clock rate of the memory circuit and a data traffic from the host processor.

Step 410 includes activating the first bank group at the address in the memory circuit. In some embodiments, step 410 includes pre-charging the first bank group in the memory circuit.

Step 412 includes scheduling execution of the first command based on an availability of a second bank group from the first round in the bank group rotation. In some embodiments, step 412 includes pre-charging the second bank group in the memory circuit when the data burst is written in the first bank group.

Figure 5:
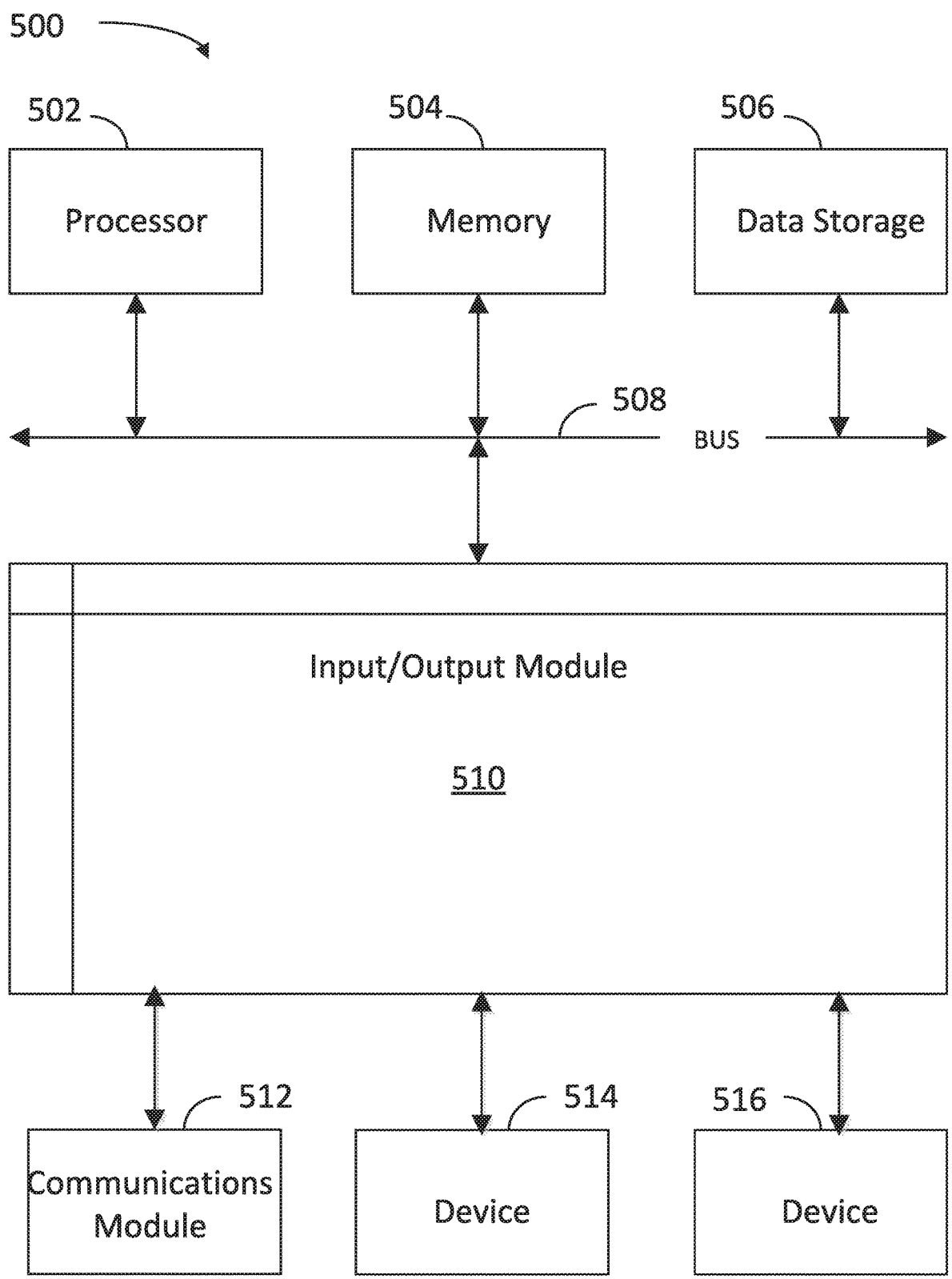
FIG. 5 is a block diagram illustrating an example computer system using a bank group rotation system to control a memory, according to some embodiments.

FIG. 5 is a block diagram illustrating an example computer system 500 using a bank group rotation system to control a memory, according to some embodiments. In certain aspects, computer system 500 can be implemented using hardware or a combination of software and hardware, either in a dedicated server, integrated into another entity, or distributed across multiple entities.

Computer system 500 includes a bus 508 or other communication mechanism for communicating information, and a host processor 502 coupled with bus 508 for processing information. By way of example, computer system 500 can be implemented with one or more host processors 502. Host processor 502 can be a general-purpose microhost processor, a microcontroller, a Digital Signal Host processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, host processor 502 may include modules and circuits configured as a 'placing' tool or engine, or a 'routing' tool or engine, to place devices and route channels in a circuit layout, respectively and as disclosed herein.

Computer system 500 includes, in addition to hardware, code that creates an execution environment for the computer program in question, e.g., code that constitutes host processor firmware, a protocol stack, a database management system, an operating system, or a combination of one or more of them stored in an included memory 504, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 508 for storing information and instructions to be executed by host processor 502. Host processor 502 and memory 504 can be supplemented by, or incorporated in, special purpose logic circuitry.

The instructions may be stored in memory 504 and implemented in one or more computer program products, i.e., one or more modules of computer program instructions encoded on a computer readable medium for execution by, or to control the operation of, the computer system 500, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 504 may also be used for storing temporary variable or other intermediate information during execution of instructions to be executed by host processor 502.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable host processors executing one or more computer programs to perform functions by operating on input data and generating output.

Computer system 500 further includes a data storage device 506 such as a magnetic disk or optical disk, coupled to bus 508 for storing information and instructions.

Computer system 500 is coupled via input/output module 510 to various devices. The input/output module 510 is any input/output module. Example input/output modules 510 include data ports such as USB ports. The input/output module 510 is configured to connect to a communications module 512. Example communications modules 512 include networking interface cards, such as Ethernet cards and modems. In certain aspects, the input/output module 510 is configured to connect to a plurality of devices, such as an input device 514 and/or an output device 516. Example input devices 514 include a keyboard and a pointing device, e.g., a mouse or a trackball, by which a user can provide input to the computer system 500. Other kinds of input devices 514 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 516 include display devices, such as a LED (light emitting diode), CRT (cathode ray tube), or LCD (liquid crystal display) screen, for displaying information to the user.

Methods as disclosed herein may be performed by computer system 500 in response to host processor 502 executing one or more sequences of one or more instructions contained in memory 504. Such instructions may be read into memory 504 from another machine-readable medium, such as data storage device 506. Execution of the sequences of instructions contained in main memory 504 causes host processor 502 to perform the process steps described herein (e.g., as in method 400). One or more host processors in a multi-processing arrangement may also be employed to execute the sequences of instructions contained in memory 504. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 500 includes servers and personal computer devices. A personal computing device and server are generally remote from each other and typically interact through a communication network. The relationship of client and server arises by virtue of computer programs running on the respective computers and having a client-server relationship to each other. Computer system 500 can be, for example, and without limitation, a desktop computer, laptop computer, or tablet computer. Computer system 500 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to host processor 502 for execution. Such a medium may take many forms, including, but not limited to, non-volatile media, volatile media, and transmission media. Non-volatile media include, for example, optical disks, magnetic disks, or flash memory, such as data storage device 506. Volatile media include dynamic memory, such as memory 504. Transmission media include coaxial cables, copper wire, and fiber optics, including the wires that comprise bus 508. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

To the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A device, comprising:
  an address extraction circuit configured to:
    extract a host address for a data burst associated with a host processor, and
    map the host address to an address in a memory circuit according to a bank group rotation schedule, wherein the bank group rotation schedule includes a plurality of bank group rotation rounds, each bank group rotation round includes memory banks in different bank groups of the memory circuit, and each bank group rotation round includes a same number of memory banks that are accessed in sequence;
  a command splitter configured to separate a first command that associates the data burst with a first round in the bank group rotation schedule;

a selection logic configured to select, from the first round in the bank group rotation schedule, a first bank group at the address in the memory circuit to execute the first command; and an execution logic configured to receive the data burst and the address in the memory circuit to:
activate the first bank group at the address in the memory circuit, and
schedule an execution of the first command based on an availability of a second bank group from the first round in the bank group rotation schedule.

2. The device of claim 1, wherein the command splitter is configured to separate a second command that associates a second data burst with a second round in the bank group rotation schedule based on a clock speed of the memory circuit.

3. The device of claim 1, wherein the command splitter is configured to separate a second command that associates a second data burst with the first round in the bank group rotation schedule based on a clock speed of the memory circuit.

4. The device of claim 1, wherein to activate a first bank group at the address in the memory circuit a bank preparation circuit is configured to pre-charge the second bank group when the data burst is written in the first bank group.

5. The device of claim 1, wherein the execution logic comprises a bank group rotation circuit configured to select the bank group rotation schedule based on a clock rate of the memory circuit and a data traffic from the host processor.

6. The device of claim 1, further comprising a command queue to receive the first command from the command splitter and to store the first command before it is selected by the selection logic and before the first bank group is activated.

7. The device of claim 1, wherein to map the host address to an address in the memory circuit the address extraction circuit is configured to select the address in the memory circuit in the second bank group based on the bank group rotation schedule.

8. A system, comprising:
a host memory storing instructions;
a host processor configured to execute the instructions and to transmit or receive multiple data bursts associated with the instructions; and
a controller coupled to a second memory and to the host processor, the controller configured to access a memory address in the second memory to read or write at least one of the data bursts at the memory address, wherein to access the memory address in the second memory the controller is further configured to:
split a command associated with the data bursts into a first command for a first data burst in a first round of a bank rotation schedule, and a second command for a second data burst in a second round of the bank rotation schedule, wherein the bank rotation schedule includes a plurality of bank group rotation rounds, each bank group rotation round includes memory banks in different bank groups of the memory circuit, and each bank group rotation round includes a same number of memory banks that are accessed in sequence,
select the memory address to a first bank group in the first command,
queue the second command after the first command, and
execute the first command in the memory address.

9. The system of claim 8, wherein the first command is a read command and the controller is further configured to extract from the first data burst an address in the host memory to write the first data burst that is read from the first bank group in the second memory.

10. The system of claim 8, wherein the first command is a write command and the controller is further configured to extract from the first data burst an address in the host memory to read the first data burst that is written in the first bank group in the second memory.

11. The system of claim 8, wherein the controller is further configured to select the memory address to the first bank group in the second command when the bank rotation schedule allows the first bank group to be ready for the second data burst after execution of the first command.

12. The system of claim 8, wherein to access a memory address in the second memory the controller is further configured to activate and pre-charge the first bank group in the memory address.

13. The system of claim 8, wherein the controller comprises a bank group rotation circuit configured to select the bank group rotation schedule based on a clock rate of the second memory and a data traffic from the host processor.

14. The system of claim 8, wherein the controller is further configured to activate the first bank group at the memory address in the second memory to execute the first command.

15. A computer-implemented method comprising:
extracting a host address for a data burst associated with a host processor;
mapping the host address to a memory address in a memory circuit according to a bank group rotation schedule, wherein the bank group rotation schedule includes a plurality of bank group rotation rounds, each bank group rotation round includes memory banks in different bank groups of the memory circuit, and each bank group rotation round includes a same number of memory banks that are accessed in sequence;
selecting a first command to handle the data burst with a first round in the bank group rotation schedule;
selecting, from the first round in the bank group rotation, a first bank group at the memory address in the memory circuit to execute the first command;
activating the first bank group at the memory address in the memory circuit, to process the data burst; and
scheduling an execution of the first command based on an availability of a second bank group from the first round in the bank group rotation schedule.

16. The computer-implemented method of claim 15, wherein
selecting a first command comprises splitting the first command into a second command, wherein the second command handles a second data burst with a second round in the bank group rotation schedule.

17. The computer-implemented method of claim 15, further comprising selecting the bank group rotation schedule based on a clock rate of the memory circuit and a data traffic from the host processor.

18. The computer-implemented method of claim 15, wherein the first command is a write command and the computer-implemented method comprises writing the data burst to the first bank group in the memory circuit.

19. The computer-implemented method of claim 15, wherein activating the first bank group comprises pre-charging the first bank group in the memory circuit.

20. The computer-implemented method of claim 15, further comprising pre-charging the second bank group in the memory circuit when the data burst is written in the first bank group.

* * * * *